(12) United States Patent
Jahjah et al.

(10) Patent No.: US 11,645,363 B2
(45) Date of Patent: May 9, 2023

(54) AUTOMATIC IDENTIFICATION OF MISCLASSIFIED ELEMENTS OF AN INFRASTRUCTURE MODEL

(71) Applicant: Bentley Systems, Incorporated, Exton, PA (US)

(72) Inventors: Karl-Alexandre Jahjah, Quebec (CA); Hugo Bergeron, Quebec (CA); Marc-André Lapointe, Quebec (CA); Kaustubh Page, Bee Cave, TX (US); Evan Rausch-Larouche, Quebec (CA)

(73) Assignee: Bentley Systems, Incorporated, Exton, PA (US)

( * ) Notice: Subject to any disclaimer, the term of this patent is extended or adjusted under 35 U.S.C. 154(b) by 18 days.

(21) Appl. No.: 17/075,412

(22) Filed: Oct. 20, 2020

(65) Prior Publication Data
US 2022/0121886 A1    Apr. 21, 2022

(51) Int. Cl.
*G06F 30/20*    (2020.01)
*G06T 17/20*    (2006.01)
(Continued)

(52) U.S. Cl.
CPC ...... *G06F 18/2193* (2023.01); *G06F 18/2148* (2023.01); *G06F 18/24155* (2023.01);
(Continued)

(58) Field of Classification Search
None
See application file for complete search history.

(56) References Cited

U.S. PATENT DOCUMENTS 7,639,868 B1    12/2009    Regli et al.
7,889,914 B2    2/2011    Regli et al.
(Continued)

OTHER PUBLICATIONS

Galaev, Magomed, "Fast, Accurate BIM Classification with Kreo," C. Kreo's automatic BIM classification product, KREO, <https://www.kreo.net/blog/fast-accurate-bim-classification-with-kreo>, Apr. 17, 2018, pp. 1-5.
(Continued)

*Primary Examiner* — Tize Ma
(74) *Attorney, Agent, or Firm* — Cesari and McKenna, LLP; James A. Blanchette

(57) ABSTRACT

In example embodiments, techniques are provided to automatically identify misclassified elements of an infrastructure model using machine learning. In a first set of embodiments, supervised machine learning is used to train one or more classification models that use different types of data describing elements (e.g., a geometric classification model that uses geometry data, a natural language processing (NLP) classification model that uses textual data, and an omniscient (Omni) classification model that uses a combination of geometry and textual data; or a single classification model that uses geometry data, textual data, and a combination of geometry and textual data). Predictions from classification models (e.g., predictions from the geometric classification model, NLP classification model and the Omni classification model) are compared to identify misclassified elements, or a prediction of misclassified elements directly produced (e.g., from the single classification model). In a second set of embodiments, unsupervised machine learning is used to detect abnormal associations in data describing elements (e.g., geometric data and textual data) that indicate misclassifications. Identified misclassifications are displayed to a user for review and correction.

19 Claims, 10 Drawing Sheets

(51) Int. Cl.

| | |
|---|---|
| *G06F 16/26* | (2019.01) |
| *G06F 18/21* | (2023.01) |
| *G06F 40/279* | (2020.01) |
| *G06V 20/64* | (2022.01) |
| *G06V 20/10* | (2022.01) |
| *G06F 18/214* | (2023.01) |
| *G06F 18/2415* | (2023.01) |

(52) U.S. Cl.
CPC .......... *G06F 40/279* (2020.01); *G06T 17/205* (2013.01); *G06V 20/176* (2022.01); *G06V 20/64* (2022.01); *G06T 2200/24* (2013.01)

(56) References Cited

U.S. PATENT DOCUMENTS

| | | | |
|---|---|---|---|
| 8,056,001 | B2 | 11/2011 | Chao |
| 8,612,373 | B2 | 12/2013 | Chidlovskii |
| 9,141,925 | B2 | 12/2015 | Jung et al. |
| 9,256,836 | B2 | 2/2016 | Ludlow et al. |
| 9,501,744 | B1 | 11/2016 | Brisebois et al. |
| 10,353,916 | B2 | 7/2019 | Bentley et al. |
| 2011/0096083 | A1 | 4/2011 | Schultz |
| 2014/0278268 | A1 | 9/2014 | Woolsey |
| 2021/0073441 | A1* | 3/2021 | Austern ............... G06K 9/4604 |
| 2021/0303695 | A1* | 9/2021 | Grosse ................ G06N 20/10 |
| 2021/0350620 | A1* | 11/2021 | Bronstein ............ G06F 17/153 |
| 2021/0406716 | A1* | 12/2021 | Broyles ................ G06N 5/04 |

OTHER PUBLICATIONS

Koo, Bonsang, et al., "Applying Novelty Detection to Identify Model Element to IFC Class Misclassifications on Architectural and Infrastructure Building Information Models," Elsevier, Society for Computational Design and Engineering, CDE, Journal of Computational Design and Engineering, vol. 5, Apr. 4, 2018, pp. 391-400.
Koo, Bonsang, et al., "Using Geometry Based Anomaly Detection to Check the Integrity of IFC Classifications in BIM Models," Journal of KIBIM, vol. 7, No. 1, Mar. 2017, pp. 18-27.
Krijnen, Thomas, et al., "Assessing Implicit Knowledge in BIM Models with Machine Learning," Design Modelling Symposium Copenhagen 2015, Jan. 2015, pp. 1-8.
Qin, Fei-wei, et al., "A Deep Learning Approach to the Classification of 3D CAD Models," Springer Nature Switzerland AG, Springer Link, Journal of Zhejiang University: Science C, vol. 15, No. 2, Feb. 7, 2014, pp. 91-106.
U.S. Appl. No. 17/034,844, filed Sep. 28, 2020 by Marc-André Lapointe et al. for Classifying Individual Elements of an Infrastructure Model, pp. 1-27.
Nelson, Dan, "Ensemble/Voting Classification in Python with Scikit-Learn," retrieved from the Internet: <https://web.archive.org/web/2020081804 5928/https://stackabuse.com/ensemble-votin g-classification-in-python-with-scikit-lea rn/>, [retrieved on Sep. 14, 2021], Aug. 18, 2020, pp. 1-11.
"Notification of Transmittal of the International Search Report and the Written Opinion of the International Searching Authority, or the Declaration," International Filing Date: Jun. 30, 2021, International Application No. PCT/US2021/039929, Applicant: Bentley Systems, Incorporated, dated Sep. 24, 2021, pp. 1-23.
Ryu, Minjung, "Machine Learning-based Classification System for Building Information Models," Master Thesis, Aalto University School of Science, Finland, Feb. 24, 2020, pp. 1-51.

* cited by examiner

AUTOMATIC IDENTIFICATION OF MISCLASSIFIED ELEMENTS OF AN INFRASTRUCTURE MODEL

BACKGROUND

Technical Field

The present disclosure relates generally to infrastructure modeling, and more specifically to techniques for identifying misclassified elements of an infrastructure model.

Background Information

In the design, construction and/or operation of infrastructure (e.g., buildings, factories, roads, railways, bridges, electrical and communication networks, equipment, etc.) it is often desirable to create infrastructure models. An infrastructure model may maintain a built infrastructure model (BIM) or digital twin of infrastructure. A BIM is a digital representation of infrastructure as it should be built, providing a mechanism for visualization and collaboration. A digital twin is a digital representation of infrastructure as it is actually built, and is often synchronized with information representing current status, working condition, position or other qualities.

It is often necessary to classify individual elements of an infrastructure model (e.g., maintaining a BIM or digital twin) in order to execute analytical tools on the model, for example, analytical tools that measure and provide dashboards for monitoring project performance (e.g., schedule, cost, and safety compliance) and the impact of design changes. The classification label of an element may indicate the element belongs to one of a number of standard classes (e.g., beam, wall, column, window, door, pipe, etc.) that permits the element to be grouped together with other similar elements. Without classification labels, running analytics may be impossible.

Infrastructure models (e.g., maintaining BIMs or digital twins) may be constructed by federating data from distributed sources. These data sources may include different amounts of classification information that utilize various different types of nomenclature. It is often impractical to establish standards for classification information and nomenclature so it is all coherent at the source. Even if standards are established, if consistency is not rigorously monitored, an organization or vendor may introduce a non-compliant data source. Further, even if this challenge could be overcome with perfect standards enforcement, sometimes classification information may be lost in the translations and conversions performed when federating the data.

Accordingly, it is often necessary to classify elements once they are in an infrastructure model. This may be done in a number of different ways. Some techniques are largely manual. For example, users may manually add or update classification information. However, infrastructure models may include huge numbers of individual elements. In addition to being extremely time consuming, manual classification may be error prone. Other techniques are largely automated. For example, machine learning may train a geometric classification model that maps geometry to classification labels, and the geometric classification model may be used to classify individual elements of the infrastructure model. However, purely geometric classification has limitations, and may sometimes return incorrect classifications.

Currently, it is very difficult to identify misclassified elements of infrastructure models so the classification information may be corrected. Misclassifications may be identified manually, by users checking each element in an infrastructure model. However, since this is extremely time consuming, it is often not practical. Some misclassifications can be identified by simple scripts or tools that may spot obvious errors. However, many types of misclassifications cannot be detected by these simplistic techniques. As a result, misclassifications persist in infrastructure models decreasing their usability and trustworthiness.

Accordingly, there is a need for techniques to address the problem of identifying misclassified elements of an infrastructure model (e.g., maintaining a BIM or digital twin).

SUMMARY

In example embodiments, techniques are provided to automatically identifying misclassified elements of an infrastructure model (e.g., maintaining a BIM or digital twin) using machine learning. In a first set of embodiments, supervised machine learning is used to train one or more classification models that use different types of data describing elements (e.g., a geometric classification model that uses geometry data, a natural language processing (NLP) classification model that uses textual data, and an omniscient (Omni) classification model that uses a combination of geometry and textual data; or a single classification model that uses geometry data, textual data, and a combination of geometry and textual data). Predictions from classification models (e.g., predictions from the geometric classification model, NLP classification model and the Omni classification model) are compared to identify misclassified elements, or a prediction of misclassified elements directly produced (e.g., from the single classification model). In a second set of embodiments, unsupervised machine learning is used to detect abnormal associations in data describing elements (e.g., geometric data and/or textual data) that indicate misclassifications. Identified misclassifications are displayed to a user for review and correction.

In one example embodiment, software of a misclassification identification service applies a machine-learning trained geometric classification model to geometric data of the infrastructure model to predict classification labels for elements of the infrastructure model, wherein a geometry-based prediction for each element of the elements of the infrastructure model is represented as a first probability vector. The software also applies a machine-learning trained NLP classification model to textual data of the infrastructure model to predict classification labels for elements of the infrastructure model, wherein a NLP-based prediction for each element of the infrastructure model is represented as a second probability vector. Optionally, the software also applies a machine-learning trained Omni classification model to geometric and textual data of the infrastructure model to predict a classification label for elements of the infrastructure model, wherein an Omni-based prediction for each element of the infrastructure model is represented as a third probability vector. The software compares the first probability vector to the second probability vector and optionally the third probability vector for each element of the infrastructure model to identify one or more elements that have been misclassified, and displays an indication of the one or more misclassified elements of the infrastructure model in a user interface.

In another example embodiment, software of a misclassification identification service determines geometric features from a three-dimensional (3D) mesh for the elements of an infrastructure model, determines a first text feature vector from a subset of a plurality of keys of textual metadata for elements of the infrastructure model, and, optionally, determines a second text feature vector from each of the plurality of keys of textual metadata for elements of the infrastructure model. The software applies a machine-learning trained single classification model to the geometric features, the first text feature vector, and optionally the second text feature vector, to predict one or more elements of the infrastructure model that have been misclassified, and displays an indication of the one or more misclassified elements of the infrastructure model in a user interface.

In yet another example embodiment, software of a misclassification identification service determines geometric features for elements of an infrastructure model and/or keys of textual metadata for elements of the infrastructure model. The software applies an unsupervised machine-learning algorithm to the geometric features for the elements and/or keys of textual metadata for the elements to identify a plurality of clusters, and determines one or more elements that deviate from their respective cluster, to identify one or more misclassified elements of the infrastructure model. Optionally, the software also applies an unsupervised machine-learning algorithm to the geometric features for the elements of the infrastructure model and/or keys of textual metadata for the elements of the infrastructure model to identify unsupervised features of the elements, groups the elements into one or more groups, and identifies one or more elements that are greater than a predetermined distance from their respective group center as one or more additional misclassified elements of the infrastructure model. The software then displays, an indication of all the misclassified elements of the infrastructure model in a user interface.

In still another example embodiment, software of a misclassification identification service applies a first machine-learning trained classification model to geometric data of an infrastructure model to predict classification labels for elements of the infrastructure model, and applies a second machine-learning trained classification model to textual data of the infrastructure model to predict classification labels for elements of the infrastructure model. Optionally, the software applies a third machine-learning trained classification model to geometric data and textual data of the infrastructure model to predict classification labels for elements of the infrastructure model. The software applies a machine-learning trained misclassification model to compare the predicted classification labels from the first classification model, and the predicted classification labels from the second classification model and, optionally, the predicted classification labels from the third classification model, and based on disagreements therein identifies one or more elements that have been misclassified, which for which indication are displayed in a user interface.

It should be understood that a variety of additional features and alternative embodiments may be implemented other than those discussed in this Summary. This Summary is intended simply as a brief introduction to the reader, and does not indicate or imply that the examples mentioned herein cover all aspects of the disclosure, or are necessary or essential aspects of the disclosure.

BRIEF DESCRIPTION OF THE DRAWINGS

The description below refers to the accompanying drawings of example embodiments, of which.

DETAILED DESCRIPTION

Figure 1:
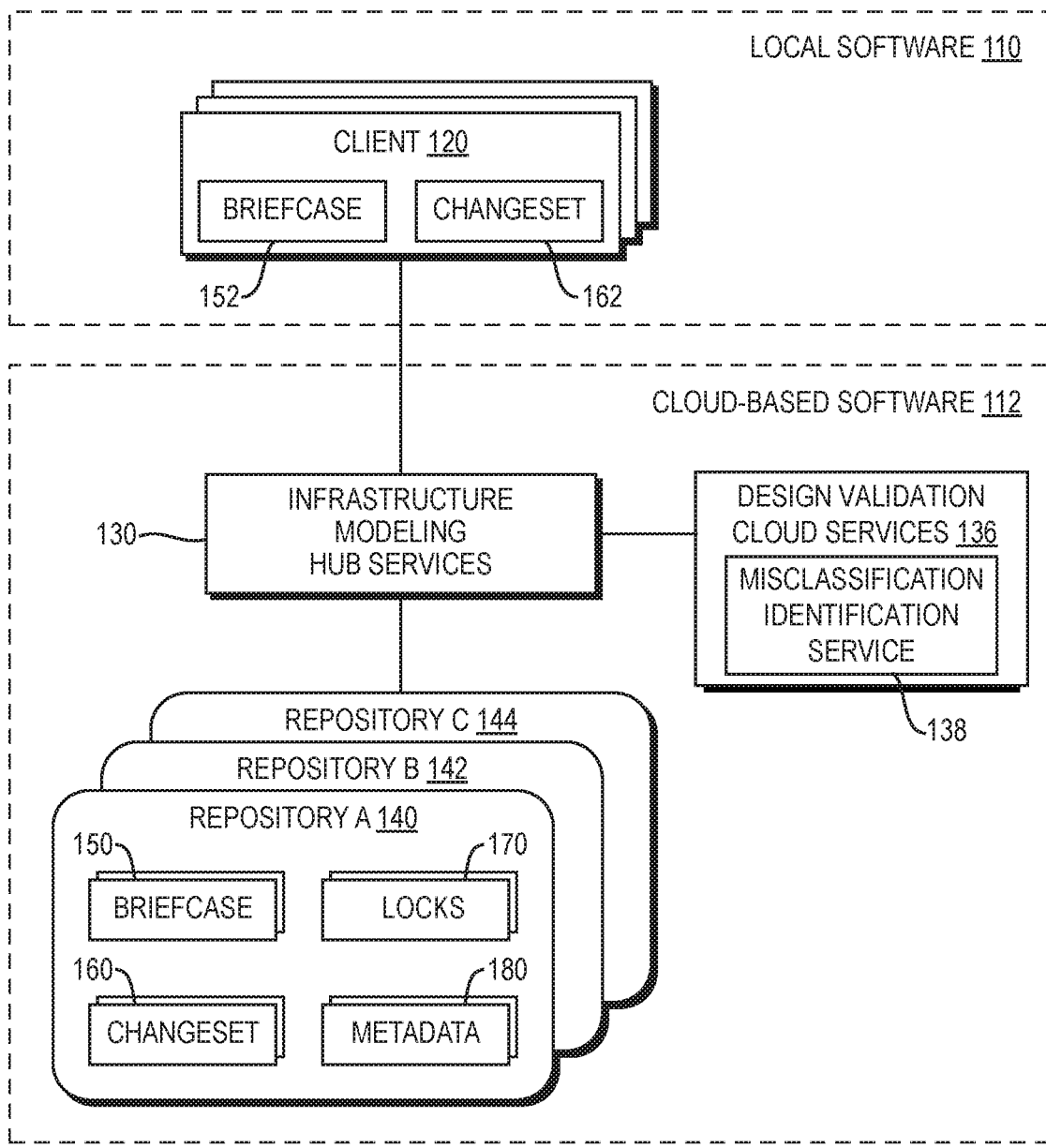
FIG. 1 is a high-level block diagram of at least a portion of an example software architecture that may implement techniques for automatic identification of misclassified elements.

FIG. 1 is a high-level block diagram of at least a portion of an example software architecture that may implement techniques for automatic identification of misclassified elements. The architecture may be divided into client-side software 110 executing on one or more computing devices arranged locally (collectively "client devices"), and cloud-based services software 112 executing on one or more remote computing devices ("cloud computing devices") accessible over the Internet.

The client-side software 110 may include client software applications (or simply "clients") 120 operated by users. The clients 120 may be of various types, including desktop clients that operate directly under an operating system of a client device and web-based client applications that operate within a web browser. The clients 120 may be concerned mainly with providing user interfaces that allow users to create, modify, display and/or otherwise interact with infrastructure models. As used herein, the term "infrastructure model" refers to a structure that maintains a digital twin, built infrastructure model (BIM) or other representation of infrastructure. One specific type of infrastructure model may be the iModel® infrastructure model. As used herein, the term "infrastructure" refers to a physical structure or object that has been built, or is planned to be built, in the real-world. Examples of infrastructure include buildings, factories, roads, railways, bridges, electrical and communication networks, equipment, etc.

The cloud-based software 112 may include infrastructure modeling hub services (e.g., iModelHub™ services) 130 other services software that manage repositories 140-144 that maintain the infrastructure models. The clients 120 and the infrastructure modeling hub services 130 may utilize a built infrastructure schema (BIS) that describes semantics of data representing infrastructure, using high-level data structures and concepts. The BIS may utilize (be layered upon) an underlying database system (e.g., SQLite) that handles primitive database operations, such as inserts, updates and deletes of rows of tables of underlying distributed databases (e.g., SQLite databases). The database system may utilize an underlying database schema (e.g., a SQLite schema) that describes the actual rows and columns of the tables.

In more detail, the conceptual schema (e.g., BIS), may describe infrastructure using elements, models, and relationships, which serve as building blocks of an infrastructure model. Physical information may serve as a "backbone", and non-physical information (e.g., analytical information, functional information, etc.) may be maintained relative to (e.g., augmenting) the "backbone." Elements represent (i.e. "model", in a colloquial sense of the term) individual entities. One element may be the "lead" element, based on the nature of the entity being modeled. Other elements typically relate back the lead element. A model acts as a container for a set of elements where the set of elements collectively represent (i.e. "model", in a colloquial sense of the term) an entity. In some cases, models may nest. That is, a model is said to "break down" a particular element into a finer-grained description. Models may be arranged according to a model hierarchy to support modeling from multiple perspectives. A single repository model may serve as a root of the model hierarchy. Relationships relate two or more elements or models. Examples of relationships include parent-child relationships that may imply ownership and peer-peer relationships that may define groups.

Likewise, the underlying database schema (e.g., a DgnDb schema) may describe how the objects are stored to individual rows of tables of the underlying databases. Elements, models and relationships may be maintained using rows of tables, which store their properties. For example, properties of an element may be stored in multiple rows of multiple tables. Such properties may include geometry and textual metadata. The geometry may include a description of vertices and faces including their sizes and relative relationships. Textual metadata may include user labels, user classes, categories and the like. To create, remove or modify an object, primitive database operations such as inserts, deletes or updates are performed by the underlying database system upon the appropriate rows of the appropriate tables.

To enable multiple versions and concurrent operation, briefcases and changesets may be utilized by clients 120 and infrastructure modeling hub services 130. A briefcase is a particular instance of a database, that when used as a constituent database of a repository 140-144, represents a materialized view of the information of a specific version of the repository. Initially an "empty" baseline briefcase may be programmatically created. Over time the baseline briefcase may be modified with changesets, which are persistent electronic records that capture changes needed to transform a particular instance from one version to a new version. A changeset often includes original values (pre-change) values of selected properties of objects as well as the new (changed) values of those selected properties.

Infrastructure modeling hub services 130 may maintain briefcases 150 and a set of accepted changesets 160 (i.e. changesets that have been successfully pushed) in a repository 140-144. The infrastructure modeling hub services 130 may also maintain locks 170 and associated metadata 180 in the repository 140-144. When a client 120 desires to operate upon an infrastructure model, it may obtain the briefcase 150 from a repository 140-144 closest to the desired state and those accepted changesets 160 from the repository 140-144 that when applied bring that briefcase up to the desired state. To avoid the need to constantly access the repository 140-144, clients may maintain a copy of a local copy 152 (a local instance of the database).

When a client 120 desires to make changes to the infrastructure model, it may use the database system to preform primitive database operations, such as inserts, updates and deletes, on rows of tables of its local copy. The client 120 records these primitive database operations and eventually bundles them to create a local changeset 162. At this stage, the local changeset 162 represents pending changes to the infrastructure model, that are reflected locally on the client 120, but that have not yet been accepted to be shared with other clients. Subsequently, the client 120 may push the local changeset 162 back to infrastructure model hub services 130 to be added to the set of accepted changesets 160 in a repository 140-144.

The infrastructure modeling hub services (e.g., iModelHub™ services) 130 may interact with a number of other services in the cloud, that perform information management and support functions. For example, information management services (not shown) may manage asset data, project data, reality data, Internet of Things (IoT) data, codes, and other features. One such service may be a design validation cloud service 136 that evaluates the impact of design changes on performance of the infrastructure model, including project schedule, cost, and safety compliance. The design validation cloud service 136 may include a misclassification identification service 138 that is capable of automatically identifying elements of an infrastructure model that have misclassified, so they may be reviewed and corrected, thereby allowing the design validation cloud service 136 to provide better evaluations. A wide variety of additional services (not shown) may also be provided that interact with infrastructure modeling hub services (e.g., iModelHub™ services) 130.

The misclassification identification service 138 of design validation cloud service 136 may utilize one or more of a number of techniques to identify misclassified elements. In a first set of embodiments, the misclassification identification service 138 implements supervised machine learning to train one or more classification models that use different types of data describing elements (e.g., a geometric classification model that uses geometry data, a natural language processing (NLP) classification model that uses textual data, and an omniscient (Omni) classification model that uses a combination of geometry and textual data; or a single classification model that uses geometry data, textual data, and a combination of geometry and textual data) whose predictions are compared to identify misclassified elements, or that directly produce a prediction of misclassified elements (e.g., from the single classification model). In a second set of embodiments, the misclassification identification service 138 uses unsupervised machine learning to detect abnormal associations in data describing elements (e.g., geometric data and/or textual data) that indicate misclassifications.

Figure 2:
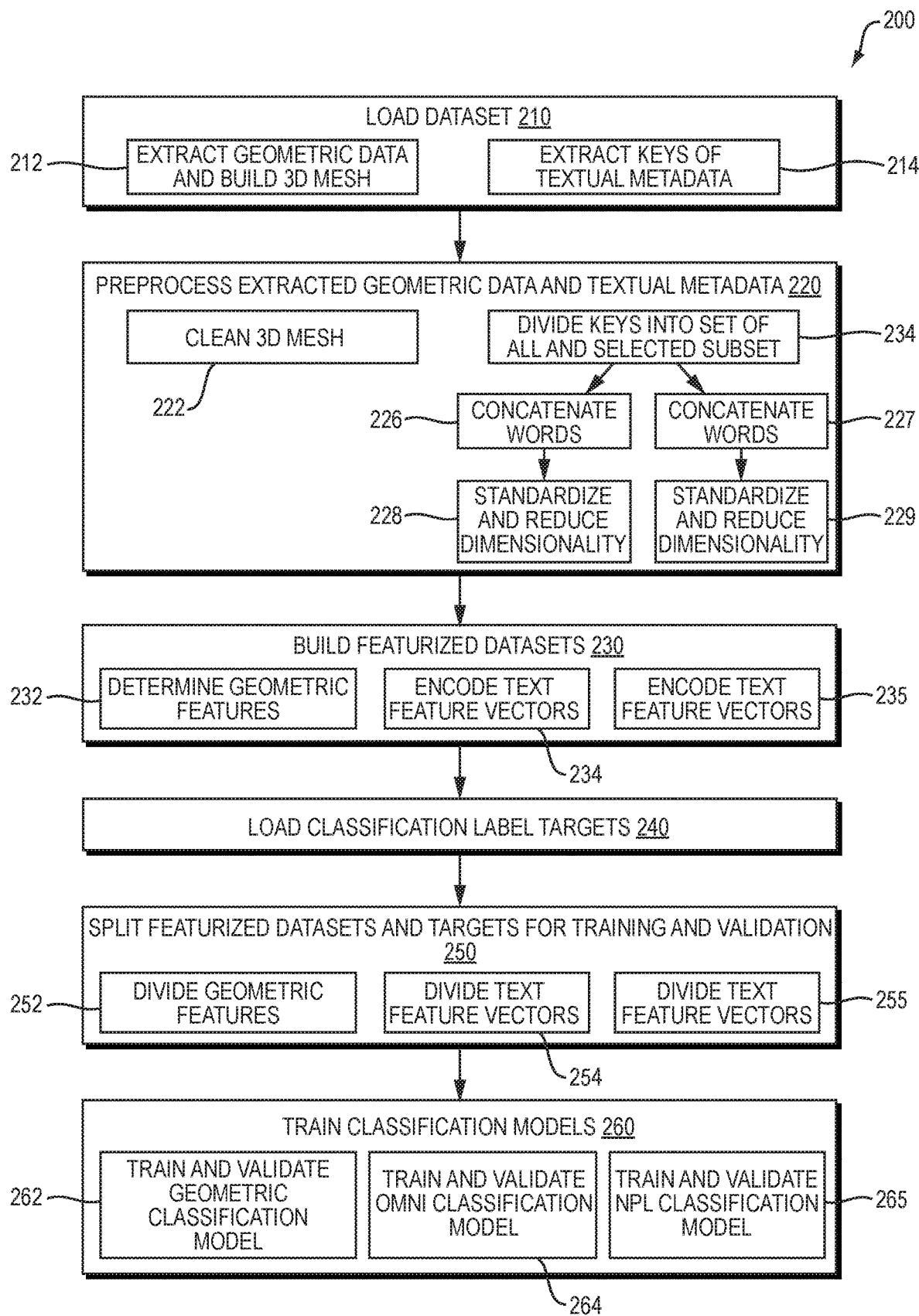
FIG. 2 is a flow diagram of an example sequence of steps that may be implemented by the misclassification identification service to train a geometric classification model, a NLP classification model, and an Omni classification model.

Looking to an embodiment of the first set of embodiments, the misclassification identification service 138 implements supervised machine learning to train one or more classification models whose predictions are compared to identify misclassified elements. FIG. 2 is a flow diagram of an example sequence of steps 200 that may be implemented by the misclassification identification service 138 to train a geometric classification model, a NLP classification model, and an Omni classification model.

At step 210, the misclassification identification service 138 loads a dataset from a training infrastructure model that includes classified elements. The loading includes a sub-step 212 of extracting geometric data that describes geometry of the classified elements and building a 3D mesh using vertices and faces indicated in the geometry data. The loading also includes a sub-step 214 of extracting keys of textual metadata for the classified elements.

At step 220, the misclassification identification service 138 preprocess the extracted geometric data and extracted keys of textual metadata. For the 3D mesh, the preprocessing involves mesh processing. The mesh processing may include the sub-step 222 of cleaning the 3D mesh. Cleaning may involve transforming the 3D mesh into a manifold 3D mesh (i.e. a "watertight" 3D mesh consisting of one closed surface that does not contain holes, missing faces, etc. and that has a clearly defined "inside") among other modifications and/or simplifications. Cleaning may re-wind one or more faces of the 3D mesh, add one or more additional faces to the 3D mesh, and/or the re-triangulate one or more faces of the 3D mesh. For the keys of textual metadata, the preprocessing includes text processing. The text processing may include the sub-step of 224 of dividing the keys of textual metadata into a set of all keys of textual metadata and a selected subset of keys of textual metadata. The selected subset may include keys indicating hierarchy and class-related information, for example, a category key, a user label key and a user class key. The text processing may also include the sub-steps of 226, 227 of concatenating words in the textual metadata for each element. To preserve provenance of each word while concatenated, tags may be provided that indicate the key from which it was obtained. The text processing may also include the sub-steps of 228, 229 of standardizing word representations and reducing dimensionality. Word representations may be standardized by removing numbers and special characters (e.g., underscores), splitting words with medial capitals (i.e. "CamelCase" words), converting text to a common case (e.g., all lowercase), replacing known abbreviations by full words, replacing synonyms by predetermined canonical words, stemming or lemmatizing words, removing short words and/or determiners, translating words to a common language (e.g., to English) using a machine translation algorithm, and the like. Reducing dimensionality may involve deleting certain words, for example, keeping only the most predictive words, keeping words identified as important using spherical k-means, etc.

At step 230, the misclassification identification service 138 builds featurized datasets based on the preprocessed geometric data and textual metadata. For the 3D mesh, the building includes the step 232 of mesh featurizing that determines geometric features for each classified element, such as metric geometric features that scale with size of the element (e.g., volume, surface area, length, width, height, etc.), dimension-less geometric features that describe shape of the element regardless of its dimensions (e.g., length over height ratio), and global geometric features that describe position and/or dimension of the element with respect to the infrastructure model as a whole. For all the keys of textual metadata and the selected subset of keys of textual metadata, the building includes the steps 234, 235 of text embedding that encodes text feature vectors for each classified element, for example, using natural language processing algorithms and pre-trained language models to produce vector representations (e.g., a one-hot vector, a frequency of occurrence vector, a relative frequency of occurrence vector, etc.). Various natural language processing algorithms and pre-trained language models may be used (e.g., Word2Vec, Bidirectional Encoder Representations from Transformer (BERT), etc.) in creating the text feature vectors.

At step 240, the misclassification identification service 138 loads the classification labels for the classified elements that are to be used as targets of classification training.

At step 250, the misclassification identification service 138 splits the featurized datasets and targets for training and validation. For the 3D mesh, the splitting includes the sub-step 252 of dividing the geometric features. For both all the keys of textual metadata, and the selected subset of keys of textual metadata, the splitting includes the steps 254, 255 of dividing the text feature vectors. In some embodiments, data may be split first into a number of folds. If k is the number of folds, then in each fold every instance will be semi-randomly assigned either to a training or validation set.

At step 260, the misclassification identification service 138 trains the classification models by applying one or more machine learning algorithms to the training datasets using the classification labels as targets, and validates the training using the validation datasets. The training includes a sub-step 262, of training and validating a geometric classification model by applying a machine learning algorithm to the geometric features of classified elements of the relevant training datasets with the classification labels as targets, and validating the training using the relevant validation datasets. The training also includes a sub-step 264 of training and validating an Omni classification model by applying a machine learning algorithm to both the geometric features and the text feature vectors from all the keys of textual metadata of classified elements of the relevant training datasets with the classification labels as targets, and validating the training using the relevant validation datasets. The training also includes a sub-step 265 of training and validating a NLP classification model by applying a machine learning algorithm to the text feature vectors from the selected subset of keys of textual metadata of classified elements of the relevant training datasets with the classification labels as targets, and validating the training using the relevant validation datasets. The machine learning algorithms used in the sub-steps 262-265 may include Random Forest algorithms, Gradient Boosting Tree algorithms, K-Nearest-Neighbours Classifier algorithms, Support Vector Classifier algorithms, Naive Bayes Classifier algorithms, Neural Network algorithms or other known machine learning algorithms. The training and validation in the sub-steps 262-265 may be broken down into training folds with cross-folds validation. For each training fold, the misclassification identification service 138 may evaluate model performance by computing sample weights for each instance in a training dataset based on a training dataset distribution, fitting a classification model to the training dataset, using the trained classification model to make predictions on a validation dataset, computing sample weights for each instance based on validation dataset distribution, and concatenating predictions and weights to produce a result. After all training folds, a combination of performance metrics (e.g., weighted accuracy, precision, recall and receiver operating characteristic (ROC)) may be computed globally and individually. Thereafter, the misclassification identification service 138 may train final classification models on all the training datasets by computing sample weights for each instance in all the training datasets based on training dataset distributions, and fitting classification models to all the training datasets.

In some implementations, in order to compare the predictions from classification models to identify misclassified elements, an additional classification model, referred to as a misclassification model, may be trained. The misclassification model may be trained using machine learning algorithms similar to the procedure set forth in FIG. 2, with a few exceptions. Rather than use extracted geometric data and textual metadata directly, the misclassification model may be trained with training datasets composed of concatenated predictions from the cross-folds validation for the geometric classification model, Omni classification model and NLP classification model performed as part of step 250. Model evaluation may be performed using cross-fold validation and sample weights. At the end of the training folds, a combination of performance metrics may be computed (e.g., ROC, precision and recall) globally and individually.

Figure 3:
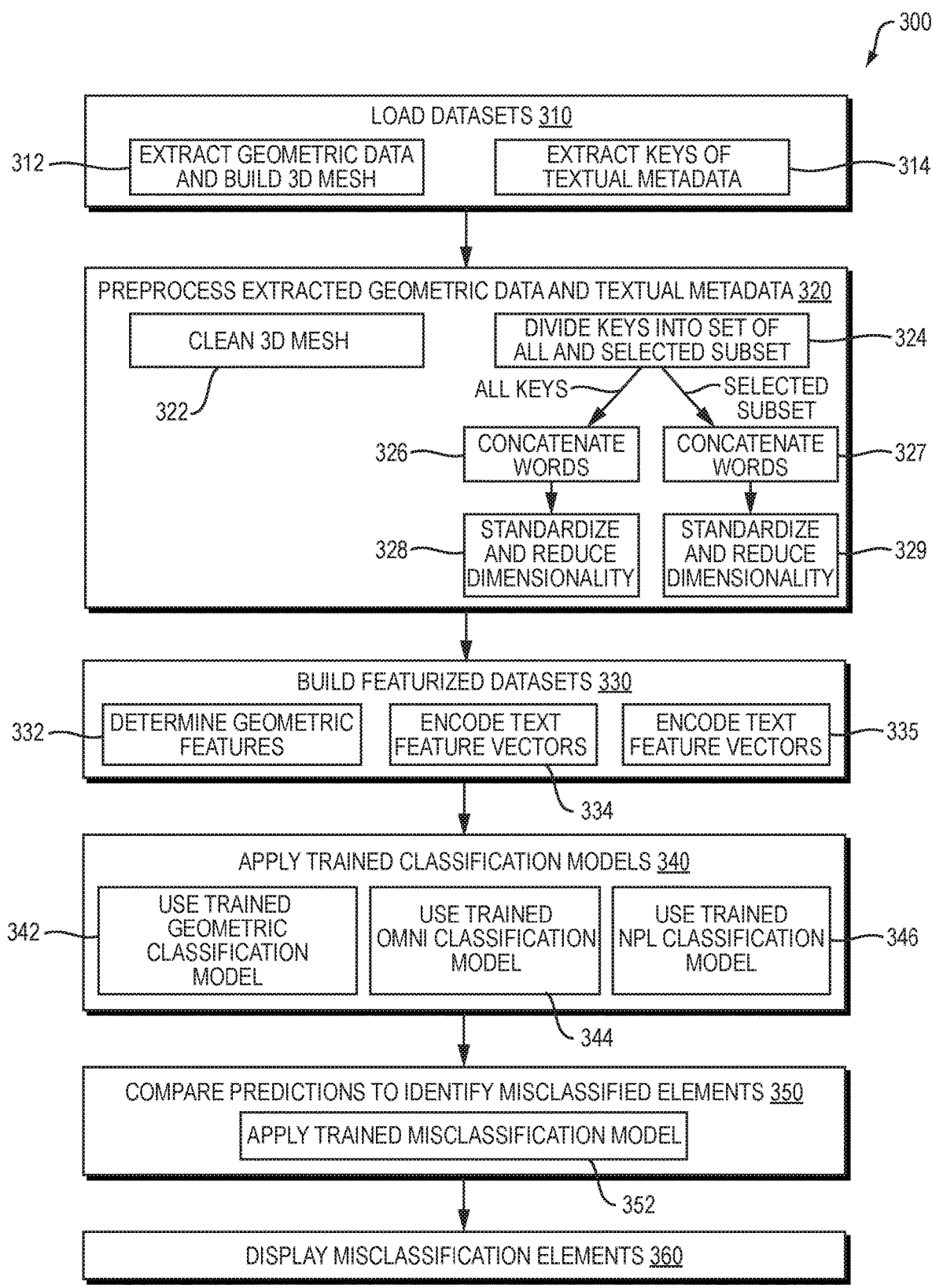
FIG. 3 is a flow diagram of an example sequence of steps that may be implemented by the misclassification identification service to utilize predictions of a trained geometric classification model, NLP classification model and Omni classification model to identify misclassified elements in an infrastructure model.
Figure 4:
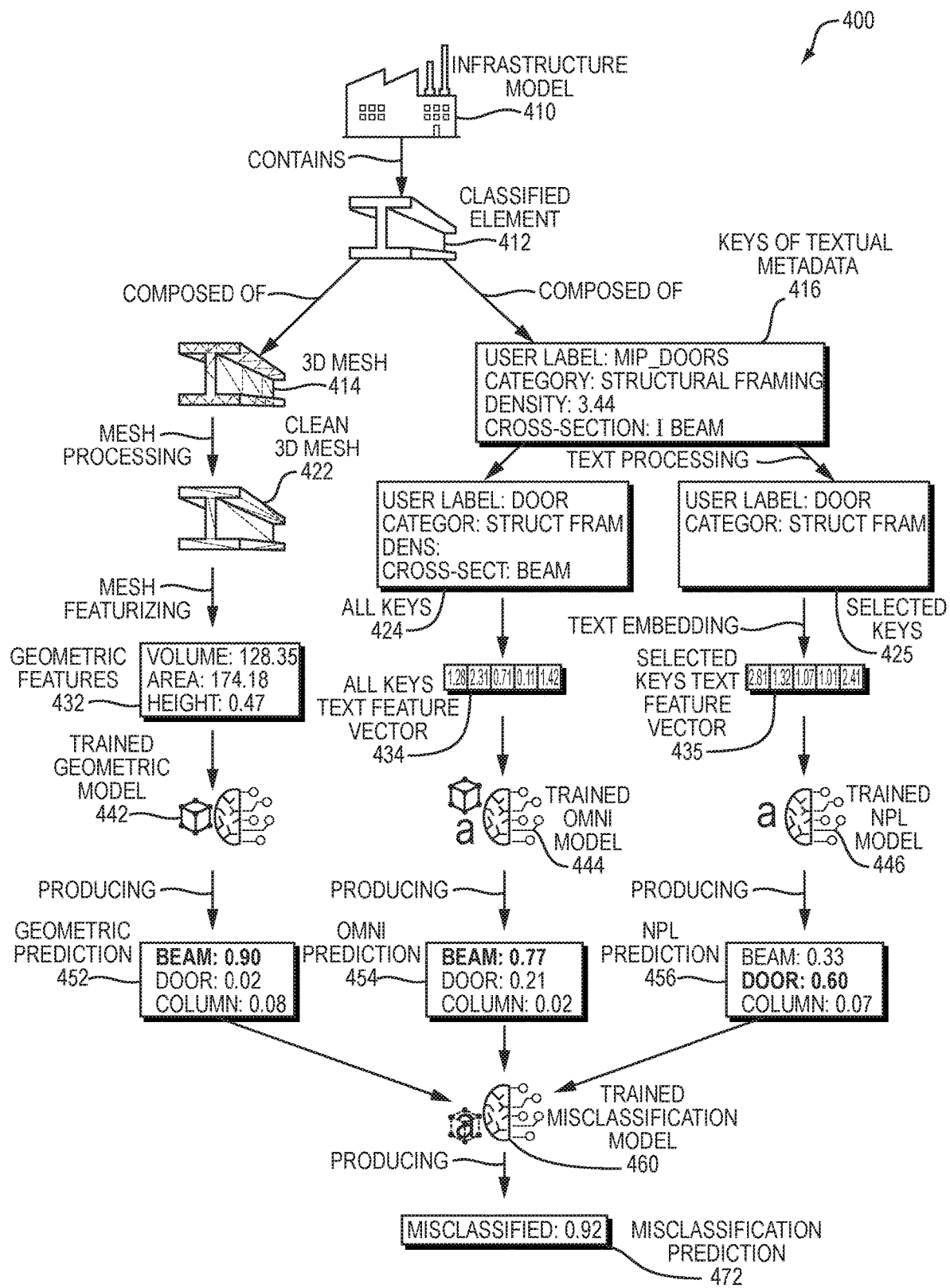
FIG. 4 is a diagram depicting a running example, that may assist in understanding the sequence of steps of FIG. 3.

FIG. 3 is a flow diagram of an example sequence of steps 300 that may be implemented by the misclassification identification service 138 to utilize predictions of a trained geometric classification model, NLP classification model and Omni classification model to identify misclassified elements in an infrastructure model. FIG. 4 is a diagram 400 depicting a running example, that may assist in understanding the sequence of steps 300 of FIG. 3.

At step 310, the misclassification identification service 138 loads datasets from the infrastructure model that contain classified elements (i.e. elements which have associated classification labels). The loading includes a sub-step 312 of extracting geometric data that describes geometry of classified elements and building a 3D mesh using vertices and faces indicated in the geometry. The loading includes a sub-step 314 of extracting keys of textual metadata for the classified elements.

Referring to FIG. 4, in a simple example an infrastructure model 410 contains a classified element 412 for which a 3D mesh 414 is built, and keys of textual metadata 416 are extracted. The keys of textual metadata 416 in this example includes user label, category, density and cross section.

At step 320, the misclassification identification service 138 preprocess the extracted geometric data and extracted keys of textual metadata. For the 3D mesh, as in training, the preprocessing involves mesh processing. The mesh processing may include the sub-step 322 of cleaning the 3D mesh, which may involve transforming the 3D mesh into a manifold 3D mesh, among other modifications and/or simplifications. For the keys of textual metadata, as in training, preprocessing includes text processing. The text processing may include the sub-step of 324 of dividing the keys of textual metadata into a set of all keys of textual metadata and a selected subset of keys of metadata; the sub-steps of 326, 327 of concatenating words in the textual metadata for each element; and the sub-steps 328, 329 of standardizing word representations and reducing dimensionality.

Referring to FIG. 4, in the example, a cleaned 3D mesh 422 may be produced and keys of textual metadata divided into a set that includes standardized and reduced dimension words for all keys of textual metadata 424, and a subset that includes standardized and reduced dimension words for just user label and category 425.

At step 330, the misclassification identification service 138 builds featurized datasets based on the preprocessed geometric data and textual metadata. For the 3D mesh, as in training, the building includes the sub-step 332 of mesh featuring that determines geometric features for each element. For all the keys of textual metadata and the selected subset of keys of textual metadata, as in training, the building includes the sub-steps 334, 335 of text embedding that encodes text feature vectors for each element.

Referring to FIG. 4, in the example, geometric features 432 indicating volume, area and height are produced and a text feature vector for all keys of textual metadata 434, and a text feature vector for just user label and category 435, are produced.

At step 340, the misclassification identification service 138 applies trained classification models to the featurized datasets to predict classification labels for elements of the infrastructure model. The applying includes the sub-step 342 of using a trained geometric classification model with the geometric features of the infrastructure model to predict classification labels for elements of the infrastructure model. The geometric prediction may be represented as a geometry-based probability vector that indicates the likelihood of each of a number of possible classification labels. The applying also includes the sub-step 344 of using a trained Omni classification model with both the geometric features and the text feature vectors from all the keys of textual metadata to predict classification labels for elements of the infrastructure model. The NLP prediction may be represented as an Omni-based probability vector that indicates the likelihood of each of a number of possible classification labels. The applying further includes the sub-step 346 of using a trained NLP classification model with text feature vectors from the selected subset of keys of textual metadata to predict classification labels for elements of the infrastructure model. The NLP prediction may be represented as a NLP-based probability vector that indicates the likelihood of each of a number of possible classification labels.

Referring to FIG. 4, in the example, the geometric features 432 are provided to a trained geometric classification model 442 to produce a geometric prediction 452 of classification labels for elements. The geometric prediction 452 indicates a beam is the most probable classification, assigning it a first probability. The geometric features 432 and the text feature vector for all keys of textual metadata 434 is provided to a trained Omni classification model 444 to produce an Omni prediction 454 of classification labels for elements. The Omni prediction 454 indicates a beam is the most probable classification, assigning it a second probability. The text feature vector for the selected subset of keys of textual metadata 435 is provided to a trained NLPclassification model 446 to produce a NLP prediction 456 of classification labels for elements. The NLP prediction 456 indicates a door is the most probable classification, assigning it a third probability.

At step 350, the misclassification identification service 138 compares the predictions, for example, the geometry based-probability vector, the Omni-based probability vector and the NLP-based probability vector, to identify elements that have been misclassified. In some implementations, the comparison simply evaluates differences in probabilities with thresholds (e.g., compares the probability of a prediction provided by one classification model to the probability of a prediction provided by another classification model). In more complicated implementations, at sub-step 352, the misclassification identification service 138 applies a machine-learning trained misclassification model to the probability vectors to produce a misclassification prediction, identifying the element and a probability of misclassification. A trained misclassification model may be capable of detecting more complicated patterns indicative of misclassifications. In some implementations, a prediction of a correct classification for the element with a confidence probability may also be produced.

Referring to FIG. 4, in the example, a trained misclassification model 460 produces a misclassification prediction 472 with a probability.

At step 360, the misclassification identification service 138 displays indications of misclassified elements of the infrastructure model in its user interface. The indications may include probability of misclassification and a prediction of a correct classification for the element. In some implementations, if the prediction of a correct classification has a confidence probability that exceeds a predetermined threshold, the classification may be automatically updated.

Figure 5:
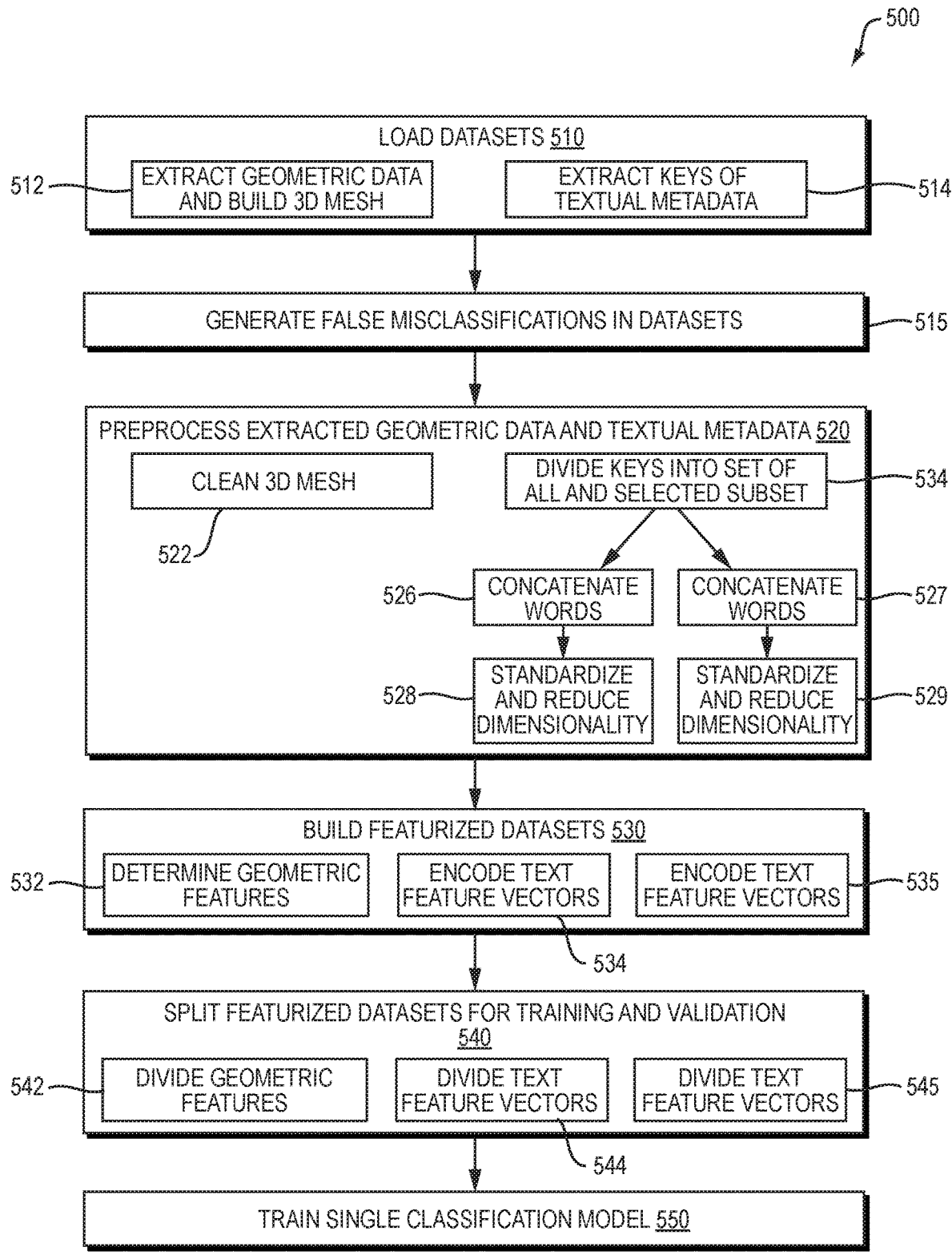
FIG. 5 is a flow diagram of an example sequence of steps that may be implemented by the misclassification identification service to train a single classification model.

Looking to another embodiment of the first set of embodiments, the misclassification identification service 138 may implement supervised machine learning to train a single classification model that directly produces a prediction of misclassified elements. The single classification model may utilize geometry data, textual data, and a combination of geometry and textual data. FIG. 5 is a flow diagram of an example sequence of steps 500 that may be implemented by the misclassification identification service 138 to train a single classification model. Several of the steps in FIG. 5 parallel operations in FIG. 2 described above, and where applicable further detail may be found in such descriptions. At step 510, the misclassification identification service 138 loads a dataset from a training infrastructure model that includes classified elements. The loading includes a sub-step 512 of extracting geometric data that describes geometry of the classified elements and building a 3D mesh using vertices and faces indicated in the geometry data. The loading also includes a sub-step 514 of extracting keys of textual metadata for the classified elements.

At optional step 515, the misclassification identification service 138 generates fake misclassifications in the datasets. Fake misclassifications involve swapping one or more keys of metadata (e.g., selected keys of metadata or all keys of metadata) of dissimilar elements (e.g., two randomly selected elements that do not share the same category or user label). Details regarding how to generate fake misclassifications and the motivations for doing so are provided below in reference to FIG. 8.

At step 520, the misclassification identification service 138 preprocess the extracted geometric data and extracted keys of textual metadata. For the 3D mesh, the preprocessing involves mesh processing. The mesh processing includes the sub-step 522 of cleaning the 3D mesh, which may involve transforming the 3D mesh into a manifold 3D mesh among other modifications and/or simplifications. For the keys of textual metadata, the preprocessing includes text processing. The text processing includes the sub-step 524 of dividing the keys of textual metadata into a set of all keys of textual metadata and a selected subset of keys of textual metadata. The selected subset may include keys that include hierarchy and class-related information, for example, a category key, a user label key and a user class key. The text processing also includes the sub-steps of 526, 527 of concatenating words in the textual metadata for each element and the sub-steps of 528, 529 of standardizing word representations and reducing dimensionality.

At step 530, the misclassification identification service 138 builds a featurized datasets based on the preprocessed geometric data and textual metadata. For the 3D mesh, the building includes the sub-step 532 of mesh featurizing that determines geometric features for each classified element. For all the keys of textual metadata and the selected subset of keys of textual metadata, the building includes the sub-steps 534, 535 of text embedding that encodes text feature vectors for each classified element.

At step 540, the misclassification identification service 138 splits the featurized datasets for training and validation. For the 3D mesh, the splitting includes the sub-step 552 of dividing the geometric features. For both all the keys of textual metadata, and the selected subset of keys of textual metadata, the splitting includes the sub-steps 554, 555 of dividing the text feature vectors. In some embodiments, data may be split first into a number of folds. If k is the number of folds, then in each fold every instance will be semi-randomly assigned either to a training or validation set.

At step 550, the misclassification identification service 138 trains the single classification model by applying one or more machine learning algorithms to the training dataset. The target of the training is whether geometry data matches textual data. The machine learning algorithm used may be a Random Forest algorithm, Gradient Boosting Tree algorithm, K-Nearest-Neighbours Classifier algorithm, Support Vector Classifier algorithm, Naive Bayes Classifier algorithm, Neural Network algorithm or other known machine learning algorithm. The training may be broken down into training folds with cross-folds validation.

Figure 6:
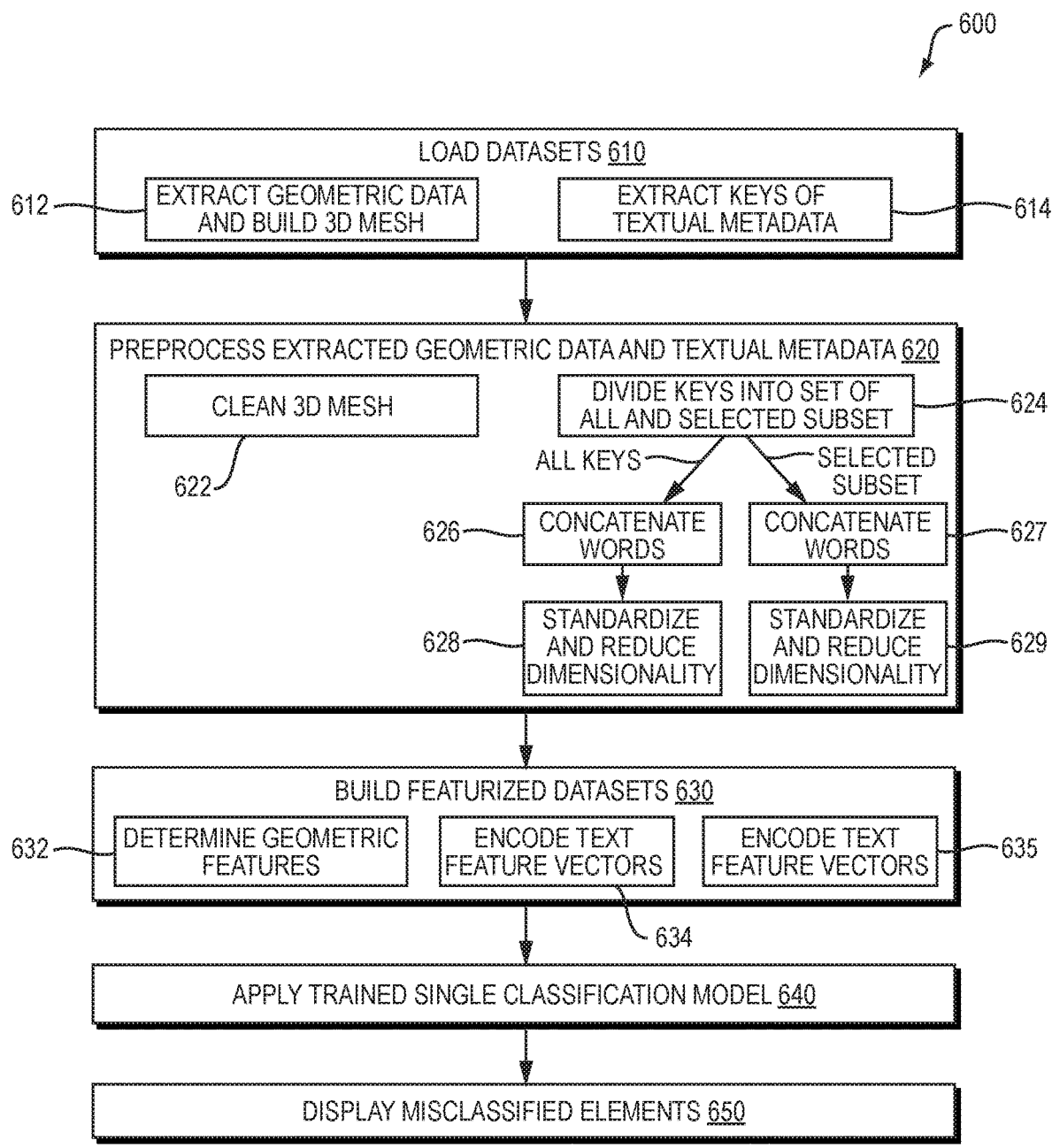
FIG. 6 is a flow diagram of an example sequence of steps that may be implemented by the misclassification identification service to use a trained single classification model.
Figure 7:
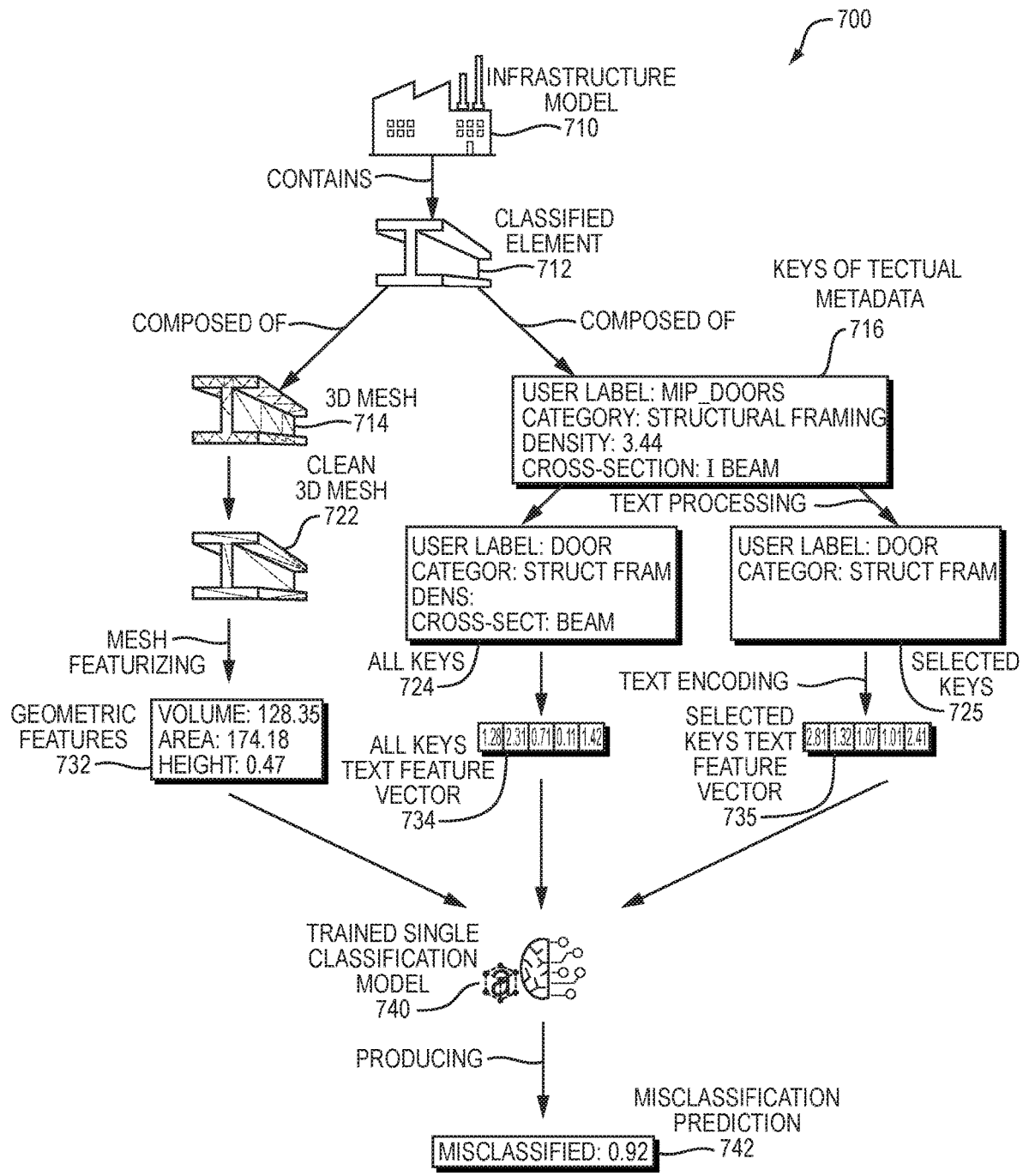
FIG. 7 is a diagram depicting a running example, that may assist in understanding the sequence of steps of FIG. 6.

FIG. 6 is a flow diagram of an example sequence of steps 600 that may be implemented by the misclassification identification service 138 to use a trained single classification model. FIG. 7 is a diagram 700 depicting a running example, that may assist in understanding the sequence of steps 600 of FIG. 6. Several of the steps in FIG. 6 and data in FIG. 7 parallel operations in FIG. 3 and data in FIG. 4 described above, and where applicable further detail may be found in such descriptions.

At step 610, the misclassification identification service 138 loads a dataset from the infrastructure model that contains classified elements (i.e. elements which have associated classification labels). The loading includes a sub-step 312 of extracting geometric data that describes geometry of classified elements and building a 3D mesh using vertices and faces indicated in the geometry. The loading includes a sub-step 314 of extracting keys of textual metadata for the classified elements.

Referring to FIG. 7, in a simple example, an infrastructure model 710 contains a classified element 712 for which a 3D mesh 714 is built and keys of textual metadata 716 are extracted.

At step 620, the misclassification identification service 138 preprocess the extracted geometric data and extracted keys of textual metadata. For the 3D mesh, as in training, the preprocessing involves mesh processing that includes the sub-step 622 of cleaning the 3D mesh. For the keys of textual metadata, as in training, preprocessing includes text processing. The text processing includes the sub-step of 624 of dividing the keys of textual metadata into a set of all keys of textual metadata and selected subset of keys of metadata, the sub-steps of 626, 627 of concatenating words in the textual metadata for each element, and the sub-steps 628, 629 of standardizing word representations and reducing dimensionality.

Referring to FIG. 7, in the example, a cleaned 3D mesh 722 is produced and keys of textual metadata divided into a set that includes standardized and reduced dimension words for all keys of textual metadata 724, and a subset that includes standardized and reduced dimension words for just user label and category 725.

At step 630, the misclassification identification service 138 builds featurized datasets based on the preprocessed geometric data and textual metadata. For the 3D mesh, as in training, the building includes the sub-step 632 of mesh featuring that determines geometric features for each element. For all the keys of textual metadata and the selected subset of keys of textual metadata, as in training, the building includes the sub-steps 634, 635 of text embedding that encodes text feature vectors for each element.

Referring to FIG. 7, in the example, geometric features 732 indicating volume, area and height are produced and a text feature vector for all keys of textual metadata 734 and a text feature vector for just user label and category 735 are produced.

At step 640, the misclassification identification service 138 applies a trained single classification model to directly produce a misclassification prediction, identifying the element and a probability of misclassification. In some implementations, a prediction of a correct classification for the element with a confidence probability may also be produced.

Referring to FIG. 7, in the example, a trained single classification model 740 produces a misclassification prediction 752 with a probability.

At step 650, the misclassification identification service 138 displays indications of misclassified elements of the infrastructure model in its user interface. The indications may include probability of misclassification and a prediction of a correct classification for the element. In some implementations, if the prediction of a correct classification has a confidence probability that exceeds a predetermined threshold, the classification may be automatically updated.

The datasets used in training the geometric classification model, the NLP classification model, the Omni classification model, and/or the single classification model may be derived from infrastructure models from actual users. Since classification of elements in infrastructure models can be very user-specific, care may be taken during training to ensure the classification models acquire both general knowledge and user-specific knowledge. For example, an organization may have its own set of rules for items such as category, user label and/or user class. Care may be taken to ensure classification models learn generally how category, user label and/or user class are indicative of classification, and not only how organization X uses category, user label and/or user class Y for a particular classification. As discussed above, instances may be weighted with weights that indicates the importance of the association. Weights may be based on a variety of factors, including number of elements with similar textual metadata, number of elements with similar geometry, number of elements in the source infrastructure model, number of elements from multiple infrastructure models of the same organization, number of elements with the same classification label, number of misclassified elements in the source infrastructure model, number of elements generated by the same design application, as well as a variety of other factors.

Further, infrastructure models from actual users may not include a large percentage of misclassifications. They may have been curated multiple times resulting in most classifications being correct. Further, the distribution of different types of misclassifications may be skewed by repeated curations. To address these issues, for training a single classification model, the misclassification identification service 138 may generate fake misclassifications by swapping one or more keys of metadata (e.g., selected keys of metadata or all keys of metadata) of dissimilar elements (e.g., two randomly selected elements that do not share the same category or user label) to generate fake misclassifications.

Figure 8:
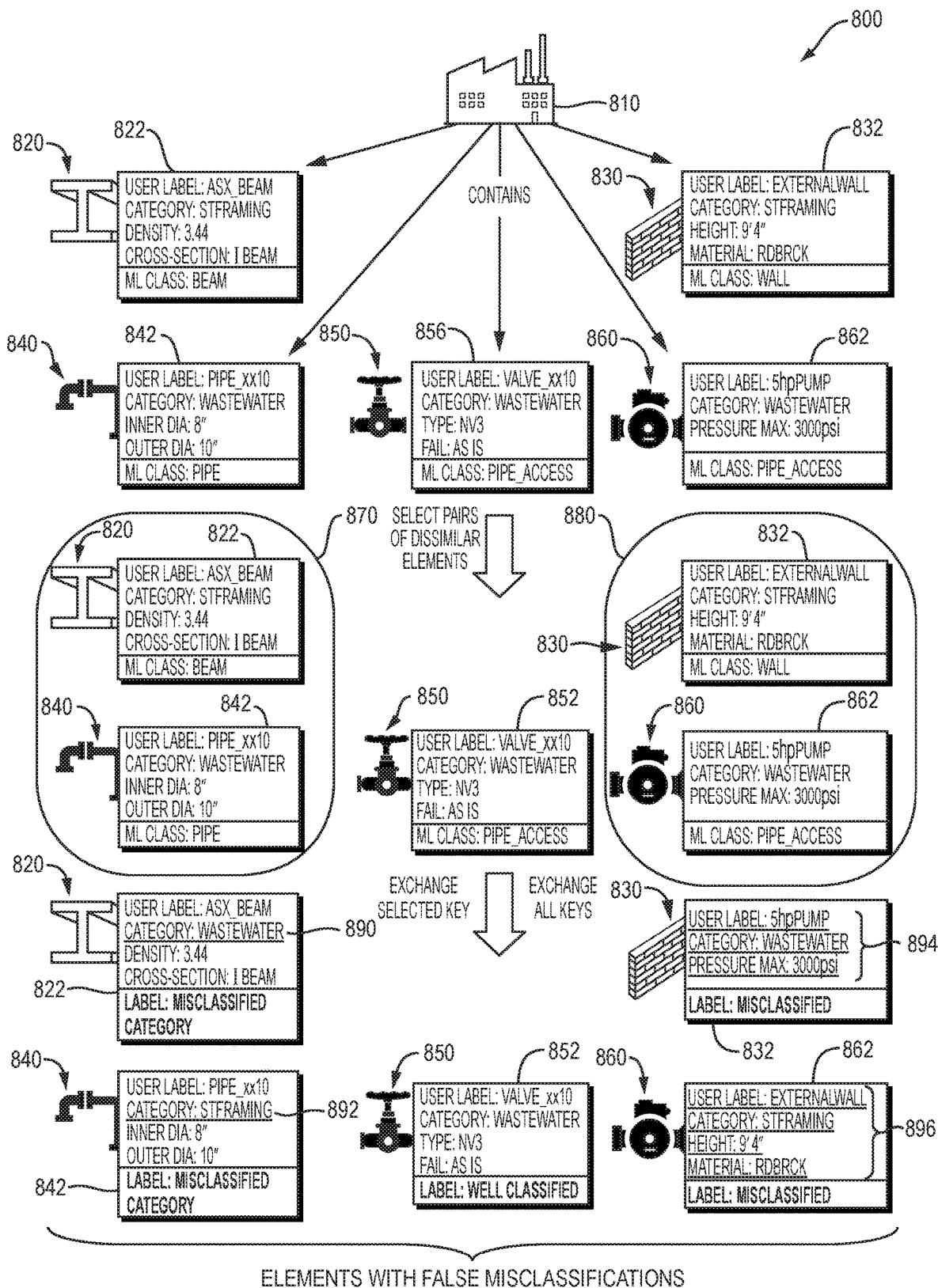
FIG. 8 is a diagram depicting an example of generating fake misclassifications.

FIG. 8 is a diagram 800 depicting an example of generating fake misclassifications. In this example, a training infrastructure model 810 initially contains five elements, namely, a beam 820, a wall 830, a pipe 840, a valve 850 and a pump 860, have corresponding keys of textual metadata 822, 832, 842, 852, 862. The misclassification identification service 138 selects pairs of dissimilar elements, for example, a first pair 870 including the beam 820 and pipe 840, and a second pair including the wall 830 and the pump 860. The misclassification identification service 138 then exchanges selected keys of metadata or all keys of metadata in each pair, and labels the elements of the pair to indicate they are misclassified. For example, the category key 890, 892 of the beam 820 and pipe 840 may be swapped and the beam 820 and pipe 840 labeled as having a misclassified category, while all the keys 894, 896 of the wall 830 and the pump 860 may be swapped and the wall 830 and the pump 860 labeled as misclassified.

Looking to an embodiment of the second set of embodiments, unsupervised machine learning is used to identify abnormal associations in geometric data and/or textual metadata that indicate misclassifications. Infrastructure models from different users may include textual metadata that uses different words to convey the same meaning. While attempts may be made to standardize words as part of preprocessing, it may be difficult to foresee all possible synonyms and variants. Further, some users may assign classification labels that are more granular than those used in training datasets (e.g., they may differentiate between two types of beams, such as I-profile and C-profile, while training datasets may simply classify elements as beams). Differences in granularity of the classification may hinder training in supervised machine learning. Unsupervised machine learning may be better able to detect misclassifications in these circumstances, relying upon deviation from unsupervised machine learning-generated clusters and/or deviation of unsupervised machine learning-generated features, rather than application of trained classification models.

Figure 9:
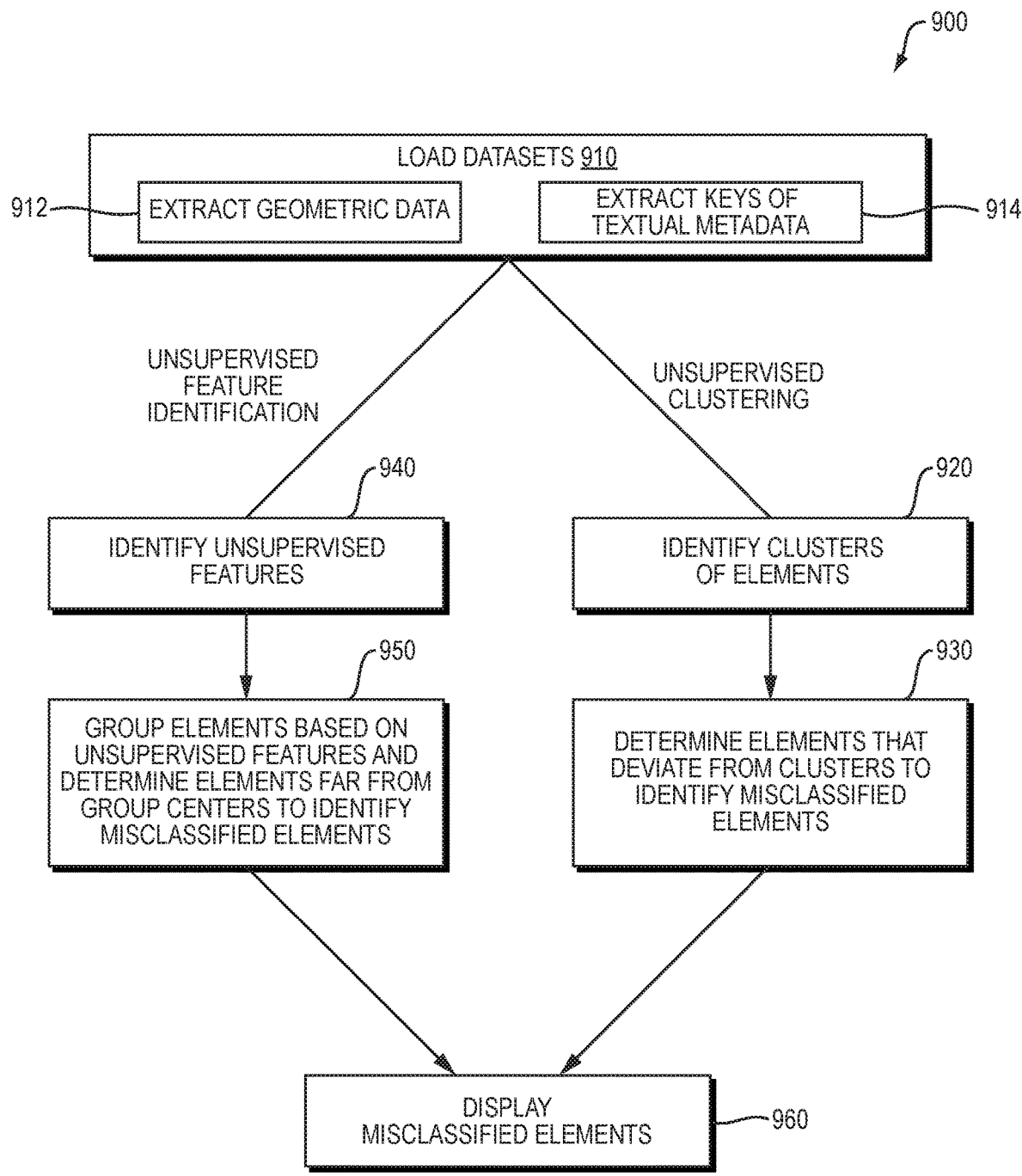
FIG. 9 is a flow diagram of an example sequence of steps that may be implemented by the misclassification identification service to utilize unsupervised machine learning to detect abnormal associations in geometric data and/or textual metadata to identify misclassified elements in an infrastructure model.
Figure 10:
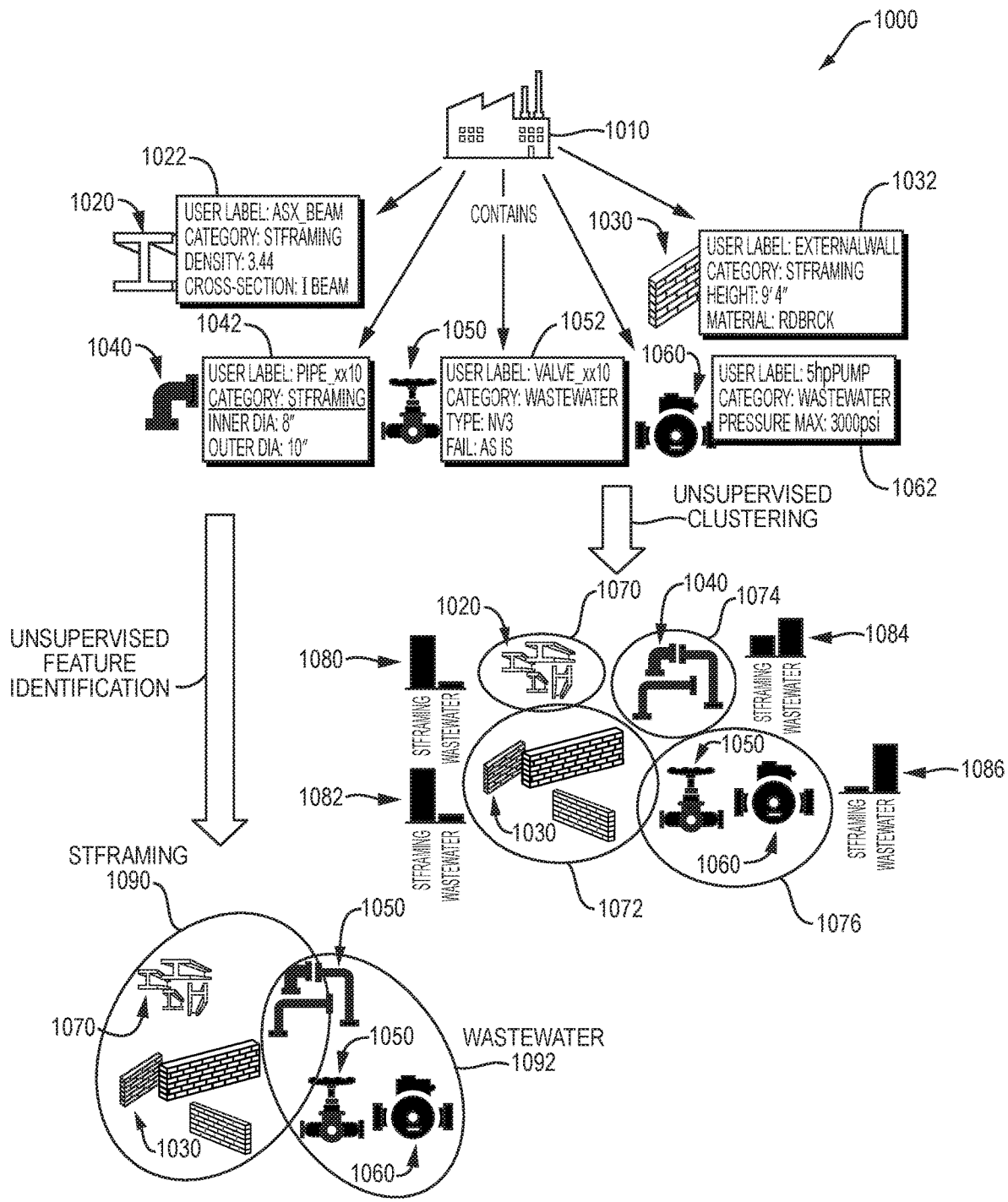
FIG. 10 is a diagram depicting a running example, that may assist in understanding the sequence of steps of FIG. 9.

FIG. 9 is a flow diagram of an example sequence of steps 900 that may be implemented by the misclassification identification service 138 to utilize unsupervised machine learning to detect abnormal associations in geometric data and/or textual metadata to identify misclassified elements in an infrastructure model. FIG. 10 is a diagram 1000 depicting a running example, that may assist in understanding the sequence of steps 900 of FIG. 9.

At step 910, the misclassification identification service 138 loads datasets from the infrastructure model that contain classified elements (i.e. elements which have associated classification labels). The loading includes a sub-step 912 of extracting geometric data that describes geometry of classified elements. The loading includes a sub-step 914 of extracting keys of textual metadata for the classified elements.

Referring to FIG. 10, in a simple example an infrastructure model 1010 contains five elements, namely, a beam 1020, a wall 1030, a pipe 1040, a valve 1050 and a pump 1060, have corresponding keys of textual metadata textual 1022, 1032, 1042, 1052, 1062. The pipe 1040 includes a misclassification, namely a category of "St Framing", where it should be "Wastewater".

At step 920, the misclassification identification service 138 applies an unsupervised machine learning algorithm to the extracted geometric data and/or the extracted keys of textual metadata to identify clusters of elements that share some similarity. The unsupervised machine learning algorithm may be a k-means clustering algorithm, a hierarchical clustering algorithm, a density-based spatial clustering of applications with noise (DBSCAN) algorithm, a gaussian mixture models (GMM) algorithm, or another type of unsupervised machine learning algorithm.

Referring to FIG. 10, in this example, the beam 1020, wall 1030, pipe 1040, valve 1050 and pump 1060 are clustered with other similar elements to form clusters 1080-1086.

At step 930, the misclassification identification service 138 determines elements with geometric data and/or textual metadata that deviate substantially from the generated clusters, and identifies these as misclassified elements.

Referring to FIG. 10, in this example, the cluster 1084 typically would exhibit a very high percentage of "St Framing" for the category and a very low percentage of "Wastewater" for the category. However, the presence of pipe 1040 in cluster 1084 skews the relationship. Pipe 1040 is therefore identified as misclassified.

At step 940, the misclassification identification service 138 applies an unsupervised machine learning algorithm to the extracted geometric data and/or the extracted keys of textual metadata and identifies unsupervised features. The algorithm used for unsupervised feature learning may be a K-means clustering algorithm, principal component analysis (PCA) algorithm, local linear embedding (LLE) algorithm, independent component analysis (ICA) algorithm, unsupervised dictionary learning algorithm or another unsupervised machine learning algorithm.

Referring to FIG. 10, in this example, a feature of category is learned and the elements 1020-1060 grouped based on category into a "St Framing" group 1090 and a "Wastewater" group 1092.

At step 950, the misclassification identification service 138 groups elements based on the unsupervised features and determines elements with that are far (in terms of statistical distance) from their group's center taking into account variance of elements in that group, and identifies these as misclassified elements.

Referring to FIG. 10, in this example, the pipe 1040 is far from the center of the "St Framing" group 1090 indicating it is likely misclassified and should belong in the "Wastewater" group 1092.

At step 960, the misclassification identification service 138 displays indications of misclassified elements of the infrastructure model in its user interface.

The indication of indications of misclassified elements displayed by the above discussed embodiments from the various sets of embodiments may take a number of forms. In some implementations, a list of misclassified elements in the infrastructure model may be displayed in a tabular form. Alternatively, or additionally, a view of the 3D mesh of the infrastructure model may be shown and misclassified elements highlighted or otherwise distinguished. Details, including a probability of, type of the misclassification, the machine learning model that identified the misclassification, etc. may be displayed upon request. Such information may also be exported (e.g., to a file) for processing and analysis by other software. To aid in reviewing potentially large numbers of misclassified elements, similarity metrics may be applied to group elements that have similar geometric features and/or keys of textual metadata. A representative member of the group may be displayed for review. Upon the user changing a classification for the representative member, the change may be propagated to all members of the group (or conversely, upon the user indicating the representative member is a false positive, an indication of false positive may be propagated to all members of the group.

It should be understood that a wide variety of adaptations and modifications may be made to the techniques. Further, in general, functionality may be implemented using different software, hardware and various combinations thereof. Software implementations may include electronic device-executable instructions (e.g., computer-executable instructions) stored in a non-transitory electronic device-readable medium (e.g., a non-transitory computer-readable medium), such as a volatile memory, a persistent storage device, or other tangible medium. Hardware implementations may include logic circuits, application specific integrated circuits, and/or other types of hardware components. Further, combined software/hardware implementations may include both electronic device-executable instructions stored in a non-transitory electronic device-readable medium, as well as one or more hardware components. Above all, it should be understood that the above description is meant to be taken only by way of example.

What is claimed is:

1. A method for automatically identifying misclassified elements of an infrastructure model using machine learning, comprising:

loading the infrastructure model, the infrastructure model containing previously classified elements one or more of which are misclassified elements that are associated with incorrect classification labels;

applying, by software executing on one or more computing devices, a machine-learning trained geometric classification model to geometric data of the infrastructure model to predict classification labels for elements of the infrastructure model, wherein a geometry-based prediction for each element of the elements of the infrastructure model is represented as a first probability vector;

applying, by the software, a machine-learning trained natural language processing (NLP) classification model to textual data of the infrastructure model to predict classification labels for elements of the infrastructure model, wherein a NLP-based prediction for each element of the infrastructure model is represented as a second probability vector;

comparing the first probability vector to the second probability vector for each element of the infrastructure model and based on disagreements therein identifying one or more elements of the infrastructure model that have been misclassified; and displaying, in a user interface of the software, an indication of the one or more misclassified elements of the infrastructure model.

2. The method of claim 1, wherein the geometric data of the infrastructure model used with the geometric classification model is geometric features obtained from a cleaned three-dimensional mesh for the elements of the infrastructure model.

3. The method of claim 1, wherein the textual data of the infrastructure model used with the NLP classification model includes text feature vectors obtained from a subset of a plurality of keys of textual metadata for elements of the infrastructure model.

4. The method of claim 1, further comprising training the geometric classification model by:

obtaining a dataset that includes classified elements that each have an associated classification label and generating a three-dimensional (3D) mesh including the classified elements;

preprocessing the 3D mesh by cleaning the 3D mesh to transform the 3D mesh into a manifold 3D mesh;

determining geometric features for each classified element using the 3D mesh; and applying a machine learning algorithm to the geometric features of classified elements of the dataset to produce the trained geometric classification model.

5. The method of claim 1, further comprising training the NLP classification model by:
obtaining a dataset that includes classified elements that each have an associated classification label and extracting a plurality of keys of textual metadata for the classified elements;
preprocessing the textual metadata by concatenating words, standardizing word representations and reducing dimensionality from a selected subset of the plurality of keys of metadata;
encoding the concatenated, standardized and reduced dimension words from the selected subset of keys of metadata into text feature vectors; and
applying a machine learning algorithm to the text feature vectors from the selected subset of keys of metadata of classified elements of the dataset to produce the trained NLP classification model.

6. The method of claim 1, further comprising
applying, by the software, a machine-learning trained omniscient (Omni) classification model to geometric and textual data of the infrastructure model to predict a classification label for elements of the infrastructure model, wherein an Omni-based prediction for each element of the infrastructure model is represented as a third probability vector, and
wherein the comparing compares the first probability vector to the second probability vector and the third probability for each element of the infrastructure model to identify the one or more elements that have been misclassified.

7. The method of claim 6, wherein the textual data of the infrastructure model used with the Omni classification model includes text feature vectors obtained from each of a plurality of keys of textual metadata for elements.

8. The method of claim 6, further comprising training the Omni classification model by:
obtaining a dataset that includes classified elements that each have an associated classification label, generating a three-dimensional (3D) mesh including the classified elements, and extracting a plurality of keys of textual metadata for the classified elements;
preprocessing the 3D mesh by cleaning the 3D mesh to transform the 3D mesh into a manifold 3D mesh and preprocessing the textual metadata by concatenating words, standardizing word representations and reducing dimensionality from the plurality of keys of metadata; and
applying a machine learning algorithm to the geometric features and the text feature vectors from the plurality of keys of metadata of classified elements of the dataset to produce the trained Omni classification model.

9. The method of claim 1, wherein the comparing determines disagreements indicating one or more elements of the infrastructure model have been misclassified by applying a trained misclassification model to at least the first probability vector and the second probability vector.

10. The method of claim 1, further comprising:
determining a probability of misclassification and prediction of a correct classification for each of the one or more misclassified elements,
wherein the indication displayed in the user interface includes the probability of misclassification and the prediction of the correct classification.

11. The method of claim 1, further comprising training at least one of the geometric model or the NLP model using a weighted dataset that includes classified elements that each have an associated classification label and a weight that indicates importance of the association.

12. The method of claim 1, wherein the comparing determines disagreements indicating one or more elements of the infrastructure model have been misclassified using a difference in probability of a prediction of the first probability vector and probability of a prediction of the second probability vector.

13. A method for automatically identifying misclassified elements of an infrastructure model using machine learning, comprising:
loading the infrastructure model, the infrastructure model containing previously classified elements one or more of which are misclassified elements that are associated with incorrect classification labels;
determining, by software executing on one or more computing devices, at least one of geometric features for the elements of the infrastructure model or keys of textual metadata for elements of the infrastructure model;
applying, by the software, an unsupervised machine-learning algorithm to at least one of geometric features for the elements of the infrastructure model or keys of textual metadata for elements of the infrastructure model to identify a plurality of clusters;
determining, by the software, one or more elements that deviate from their respective cluster to identify the one or more misclassified elements of the infrastructure model; and
displaying, in a user interface of the software, an indication of the one or more misclassified elements of the infrastructure model.

14. The method of claim 13, further comprising:
applying, by the software, another machine-learning algorithm to at least one of geometric features for the elements of the infrastructure model or keys of textual metadata for elements of the infrastructure model to identify unsupervised features of the elements of the infrastructure model;
grouping, by the software, the elements of the infrastructure model into one or more groups and identifying one or more elements that are greater than a predetermined distance from their respective group center as one or more additional misclassified elements of the infrastructure model; and
displaying, in the user interface of the software, an indication of the one or more additional misclassified elements of the infrastructure model.

15. A non-transitory electronic device readable medium having instructions that when executed on one or more processors of one or more electronic devices are operable to:
load an infrastructure model, the infrastructure model containing classified elements one or more of which are misclassified elements that are associated with incorrect classification labels;
apply a first machine-learning trained classification model to geometric data of the infrastructure model to predict probabilities of classification labels for elements of the infrastructure model;
apply a second machine-learning trained classification model to textual data of the infrastructure model to predict probabilities of classification labels for elements of the infrastructure model;
apply a machine-learning trained misclassification model to compare the predicted probabilities of classification labels from the first classification model and the predicted probabilities of classification labels from the second classification model and based on disagreements therein to identify one or more elements that have been misclassified; and display an indication of the one or more misclassified elements.

16. The non-transitory electronic device readable medium of claim 15, wherein the first classification model is a trained geometric classification model that examines geometric features, wherein the geometric features are obtained from a cleaned three-dimensional mesh for the elements of the infrastructure model.

17. The non-transitory electronic device readable medium of claim 16, wherein the second classification model is a trained natural language processing (NLP) classification model that examines text feature vectors obtained from a subset of a plurality of keys of textual metadata for elements of the infrastructure model.

18. The non-transitory electronic device readable medium of claim 16, further comprising instructions that when executed are operable to:

apply a third classification model to geometric data and textual data of the infrastructure model to predict probabilities of classification labels for elements of the infrastructure model, and wherein the trained misclassification model is applied to compare the predicted probabilities of classification labels from the first classification model, the predicted probabilities of classification labels from the second classification model, and the predicted probabilities of classification labels from the third classification model and based on disagreements therein to identify the one or more elements that have been misclassified.

19. The non-transitory electronic device readable medium of claim 18, wherein the third classification model is a trained omniscient (Omni) classification model that examines geometric features and text feature vectors for a plurality of keys of textual metadata for elements of the infrastructure model.

* * * * *